US 8,233,762 B1

(12) United States Patent
Boyden et al.

(10) Patent No.: US 8,233,762 B1
(45) Date of Patent: Jul. 31, 2012

(54) CABLE MANAGEMENT SYSTEM

(75) Inventors: Demick Boyden, Pleasanton, CA (US);
David J. Lima, Los Altos, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 366 days.

(21) Appl. No.: 12/562,570

(22) Filed: Sep. 18, 2009

(51) Int. Cl.
*G02B 6/00* (2006.01)

(52) U.S. Cl. ........ 385/134; 385/135; 385/136; 385/137; 361/728; 361/741; 361/752

(58) Field of Classification Search .................. None
See application file for complete search history.

(56) References Cited

U.S. PATENT DOCUMENTS

| 5,479,553 | A | * | 12/1995 | Daems et al. ................ 385/135 |
| 6,249,633 | B1 | * | 6/2001 | Wittmeier et al. ............ 385/135 |
| 6,590,785 | B1 | | 7/2003 | Lima et al. |

* cited by examiner

*Primary Examiner* — Uyen Chau N Le
*Assistant Examiner* — Chad Smith
(74) *Attorney, Agent, or Firm* — Harrity & Harrity, LLP

(57) ABSTRACT

A system manages cables to connect to a device provided in a device chassis. The system includes a cable management boom connected to a top portion of the device chassis, cable management shelves connected to a side portion of the device chassis, and a cable management arm connected to and supported by the cable management shelves. The cable management arm is to retain the cables, pivot through an angle to provide access to the device provided in the device chassis, and route the cables from the device to the cable management boom. The cable management boom is to gather the cables, retain the cables, and route the cables above the device chassis.

22 Claims, 13 Drawing Sheets

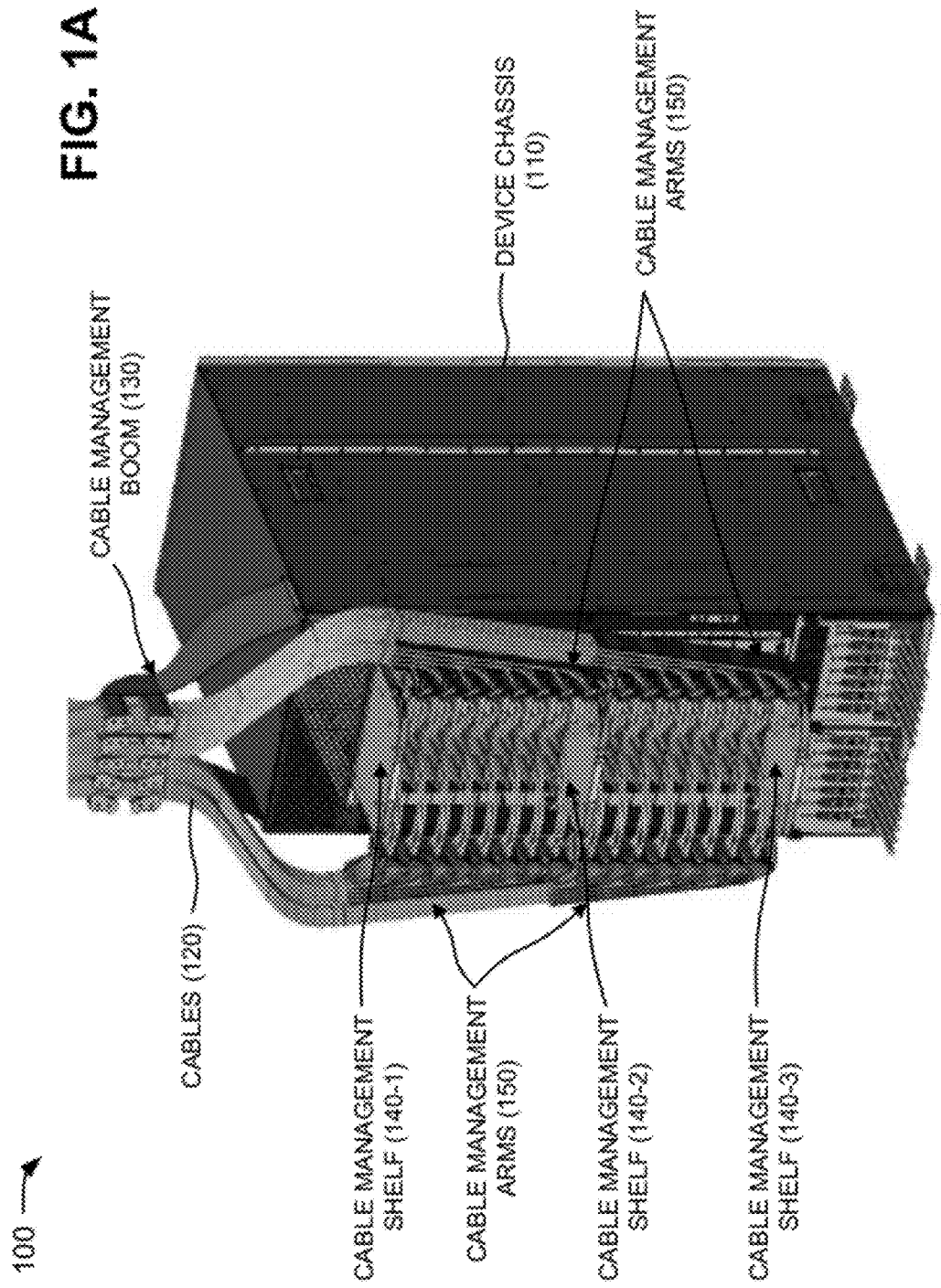

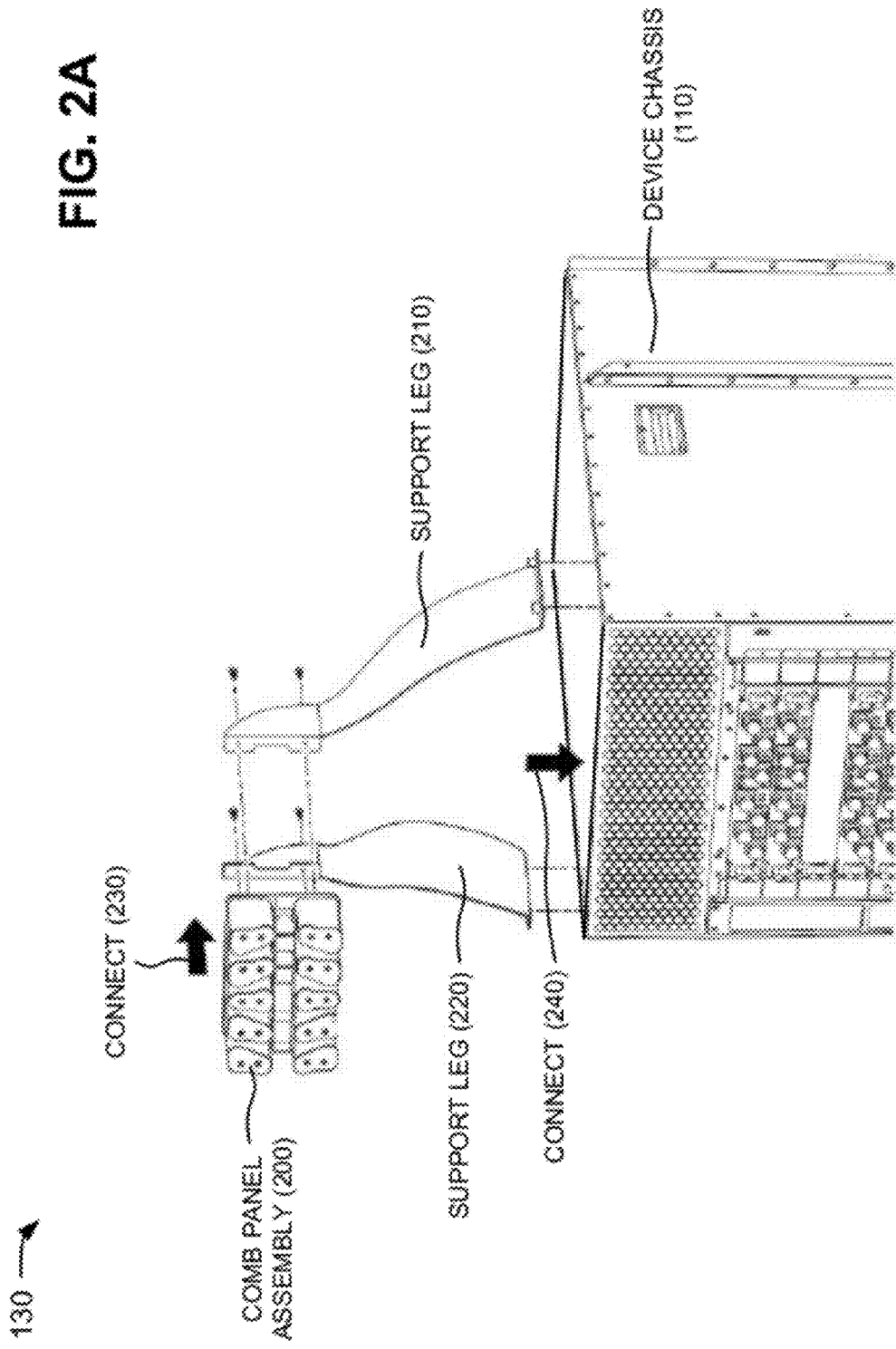

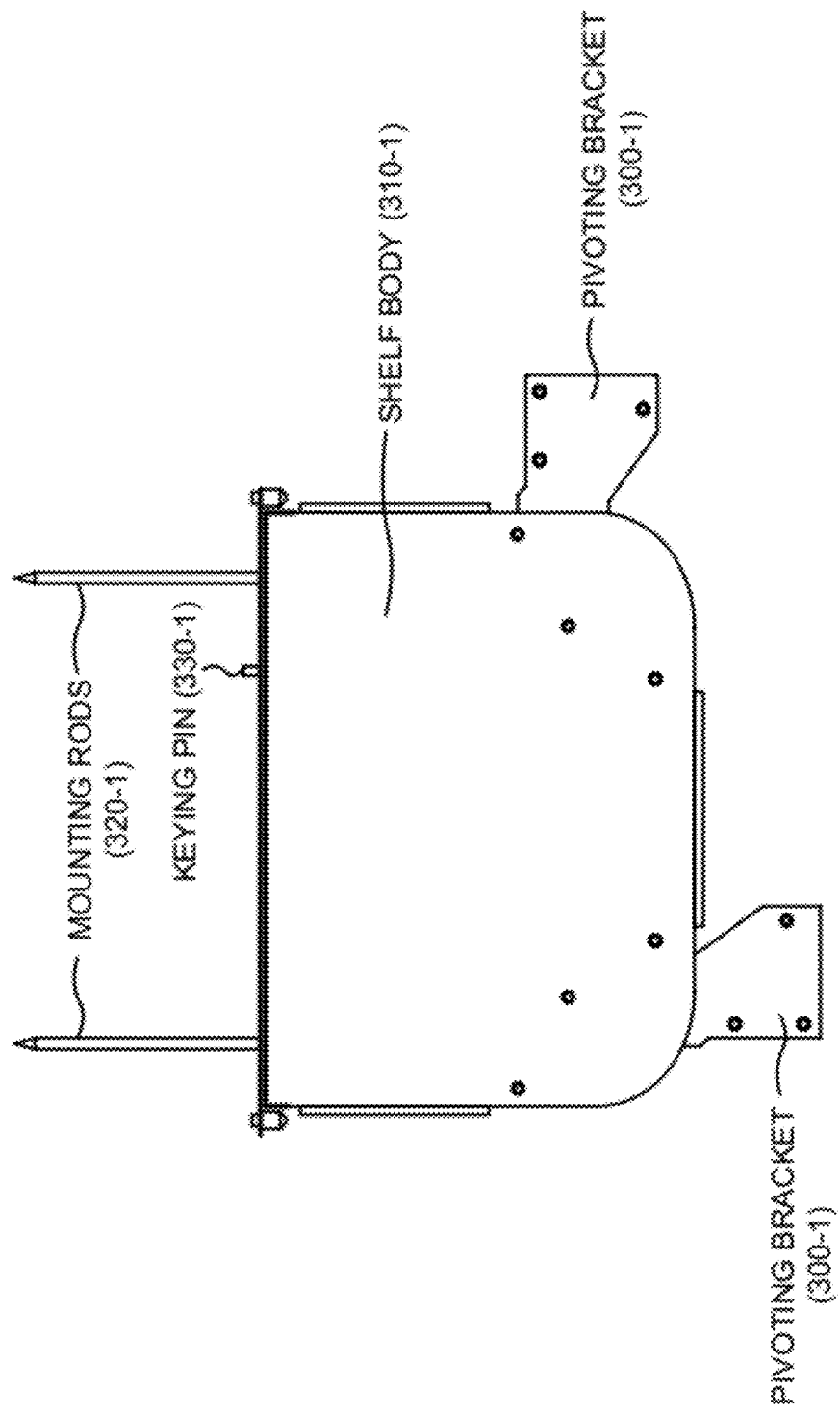

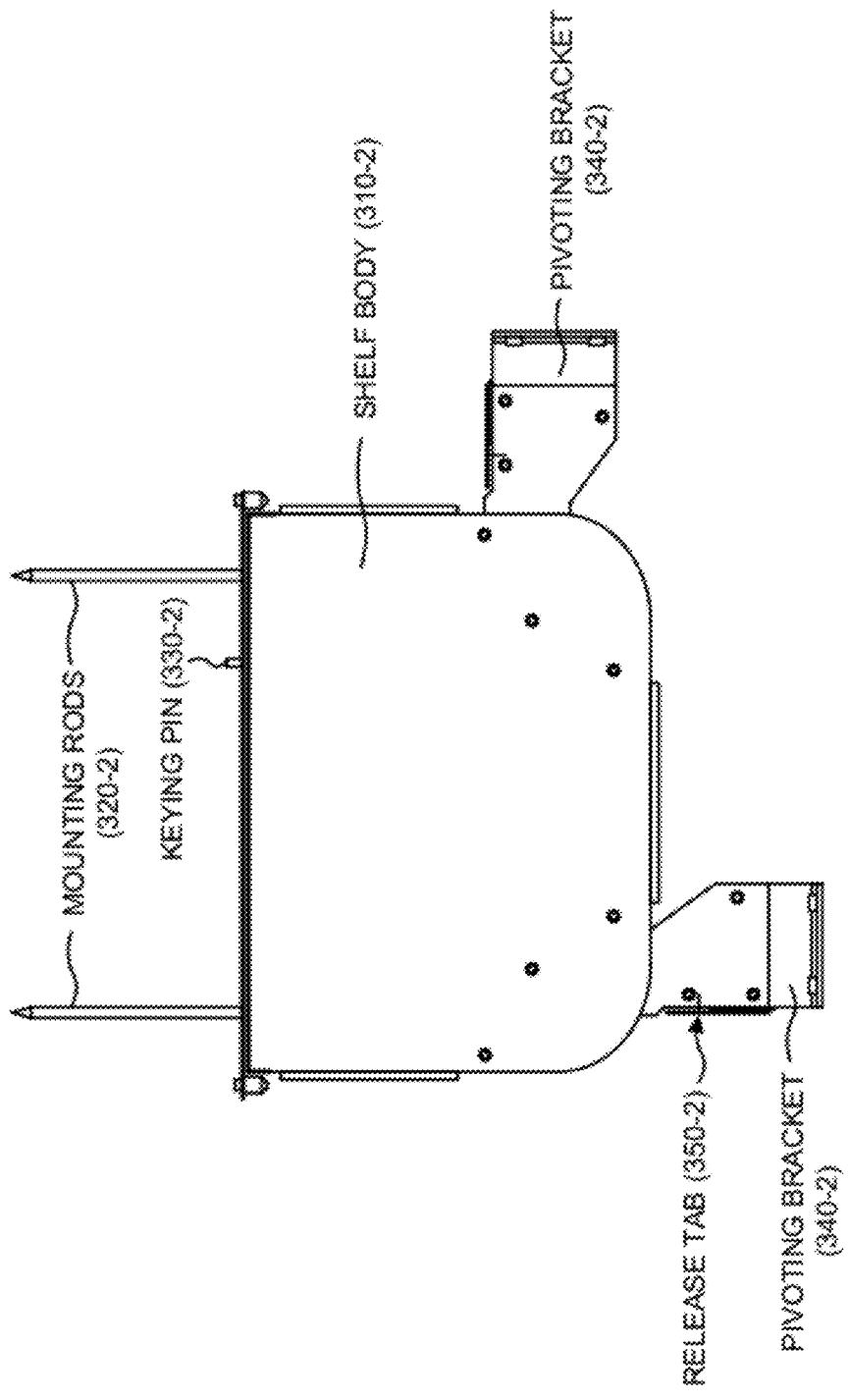

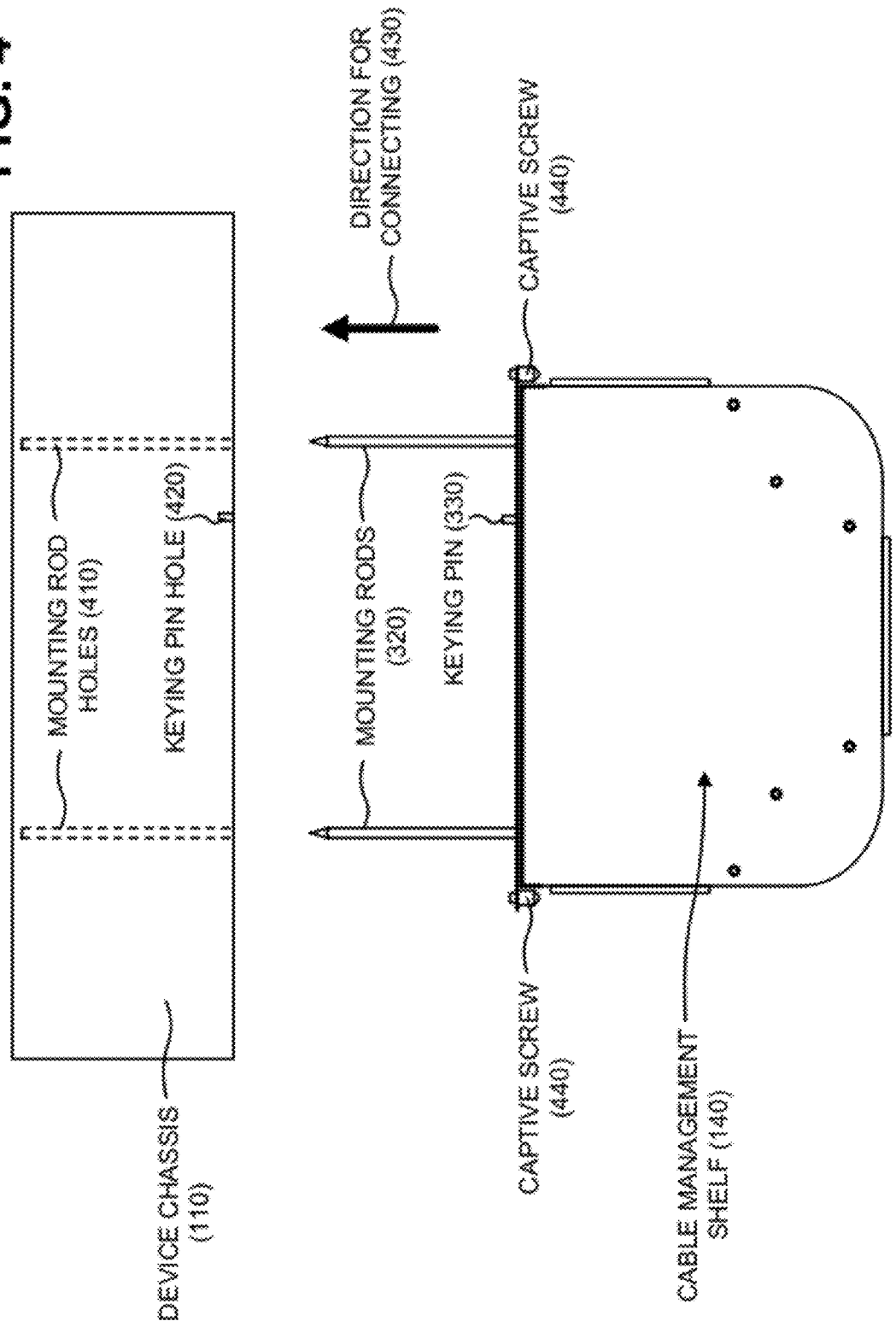

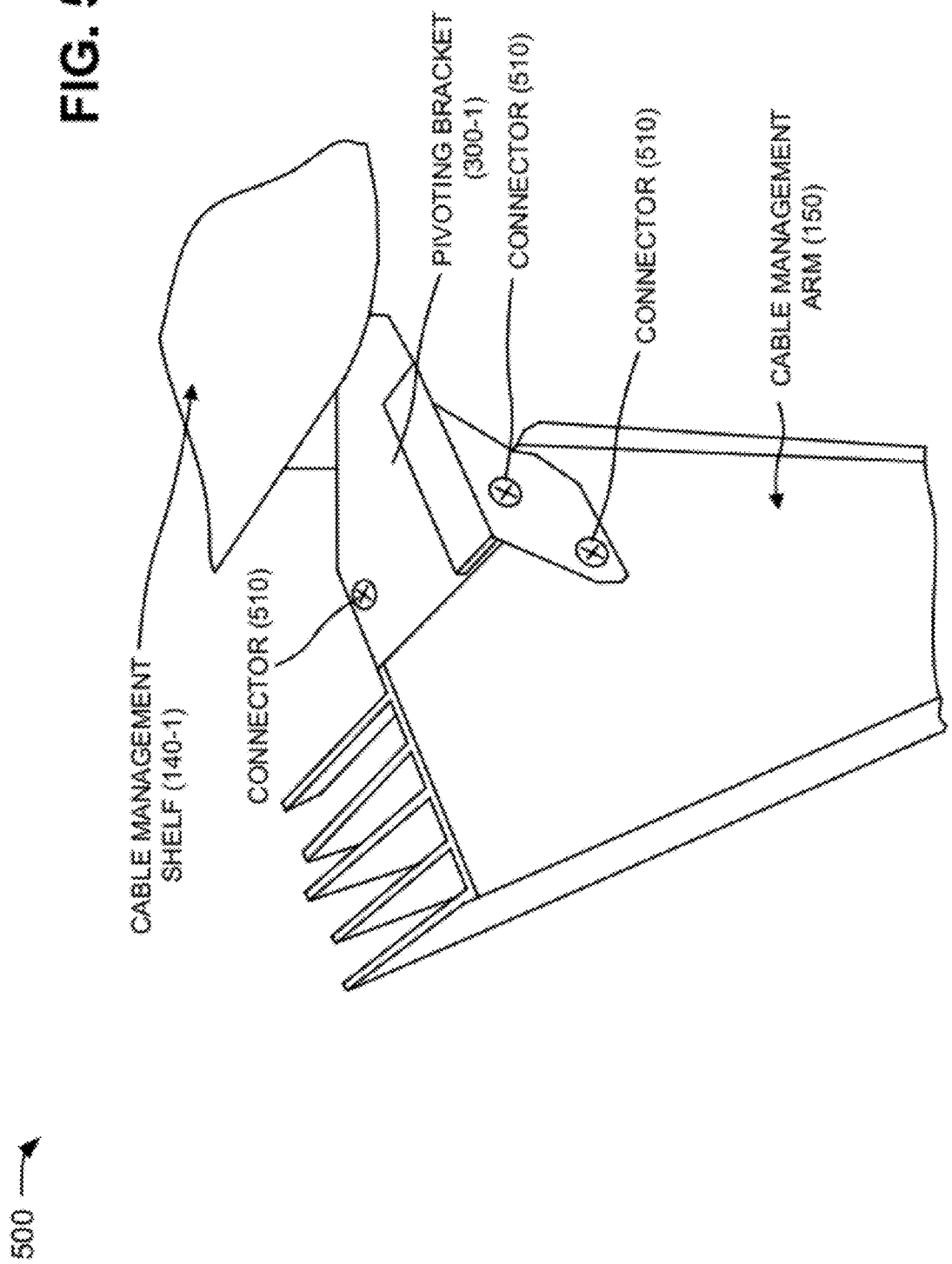

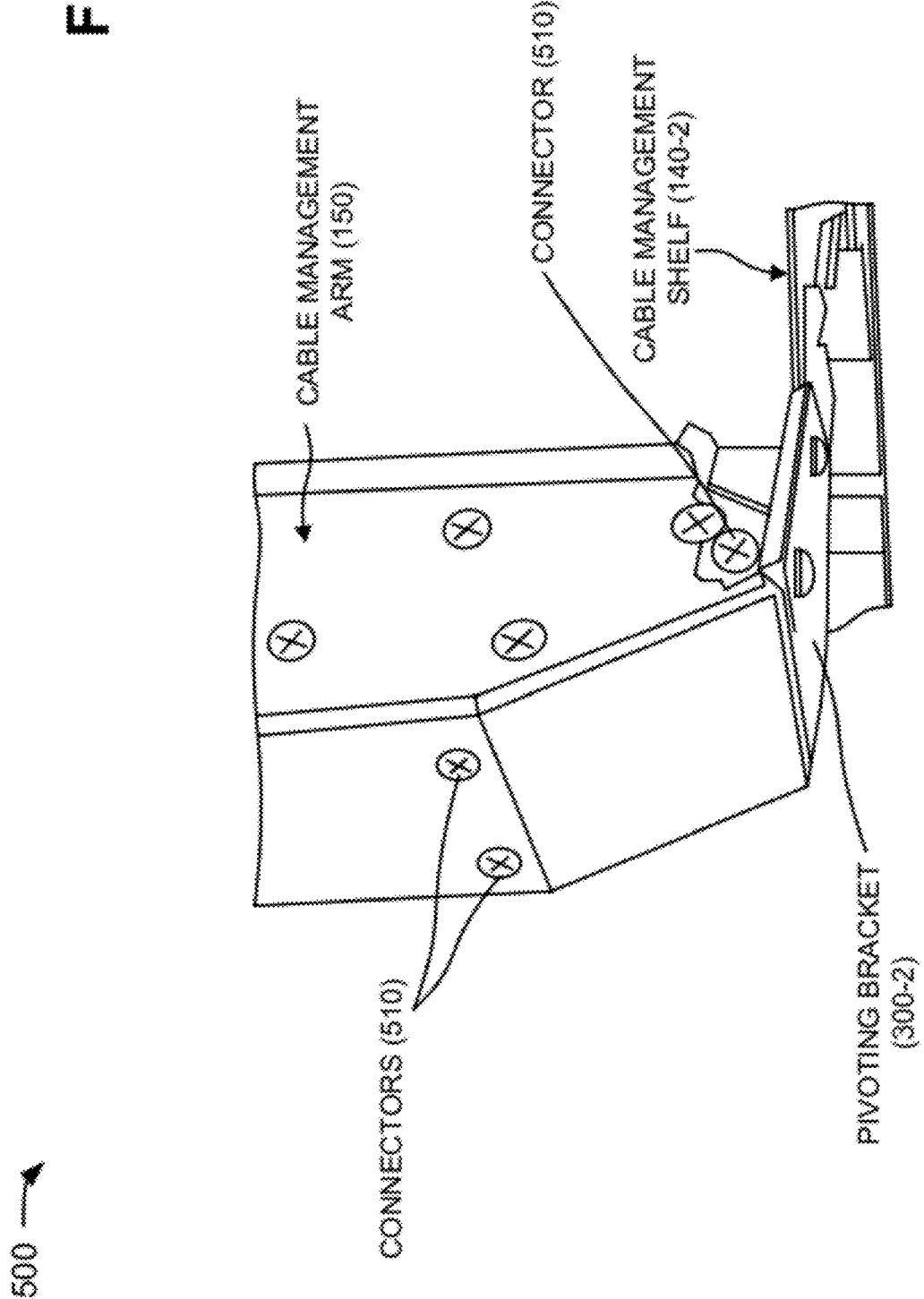

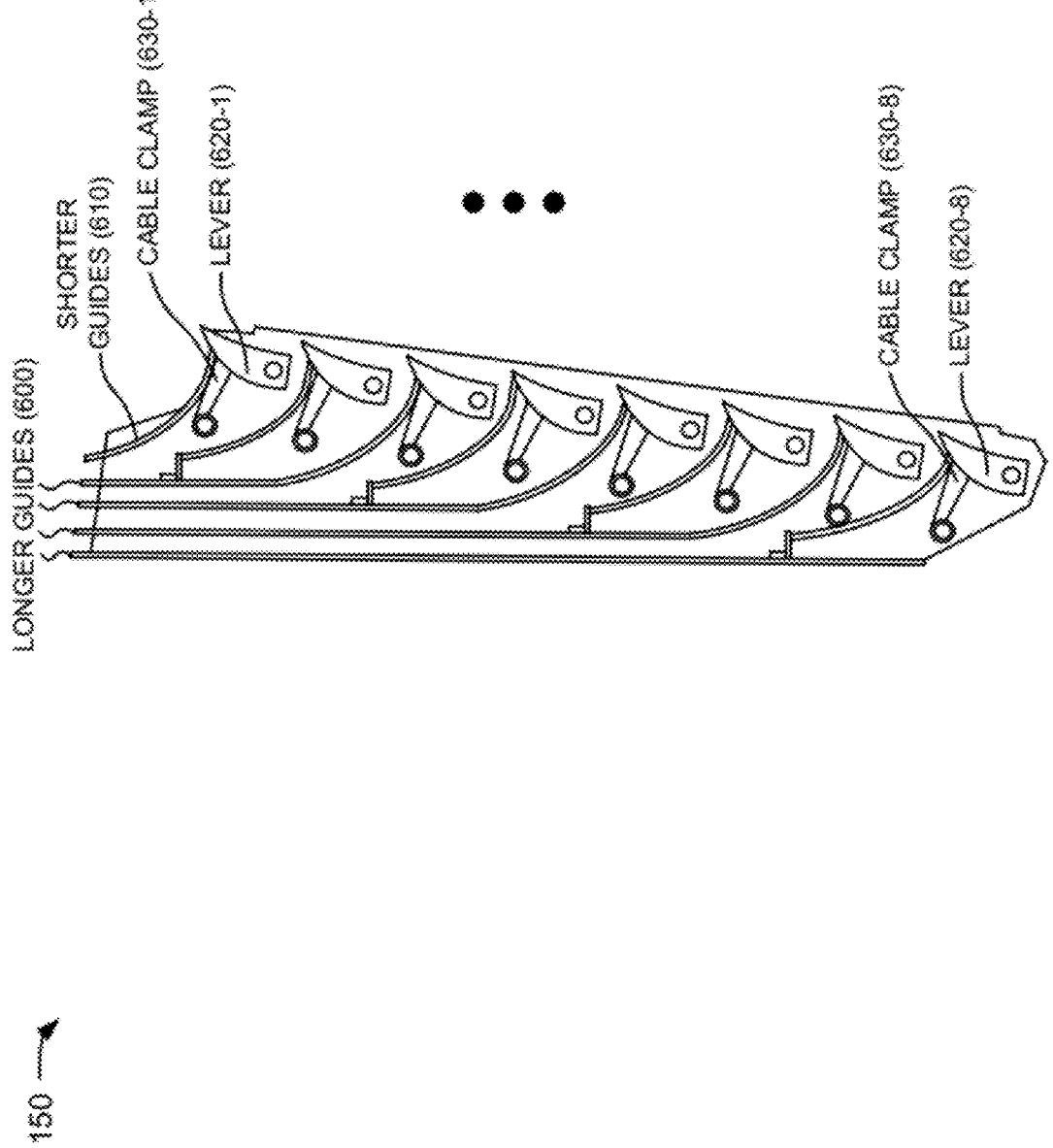

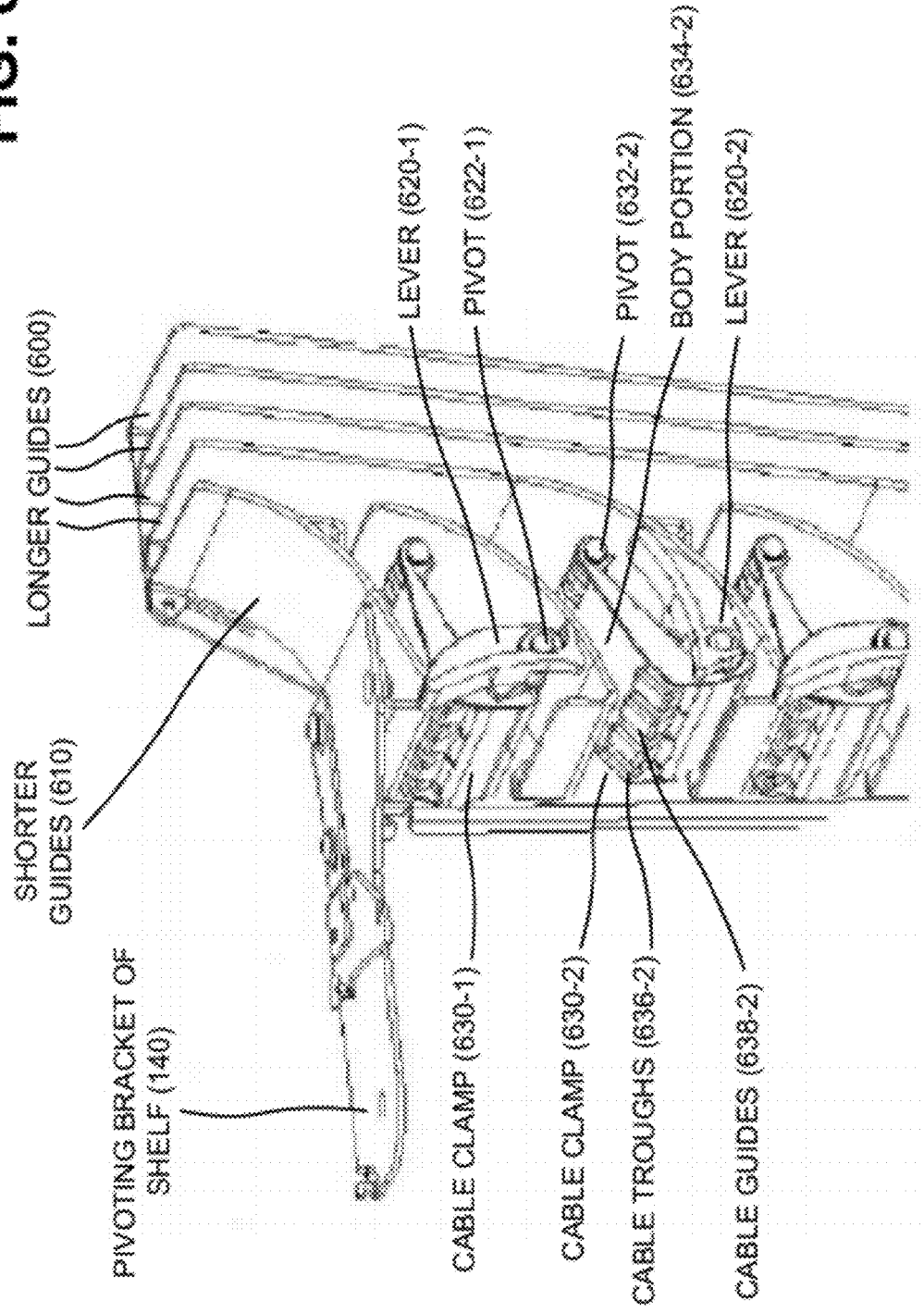

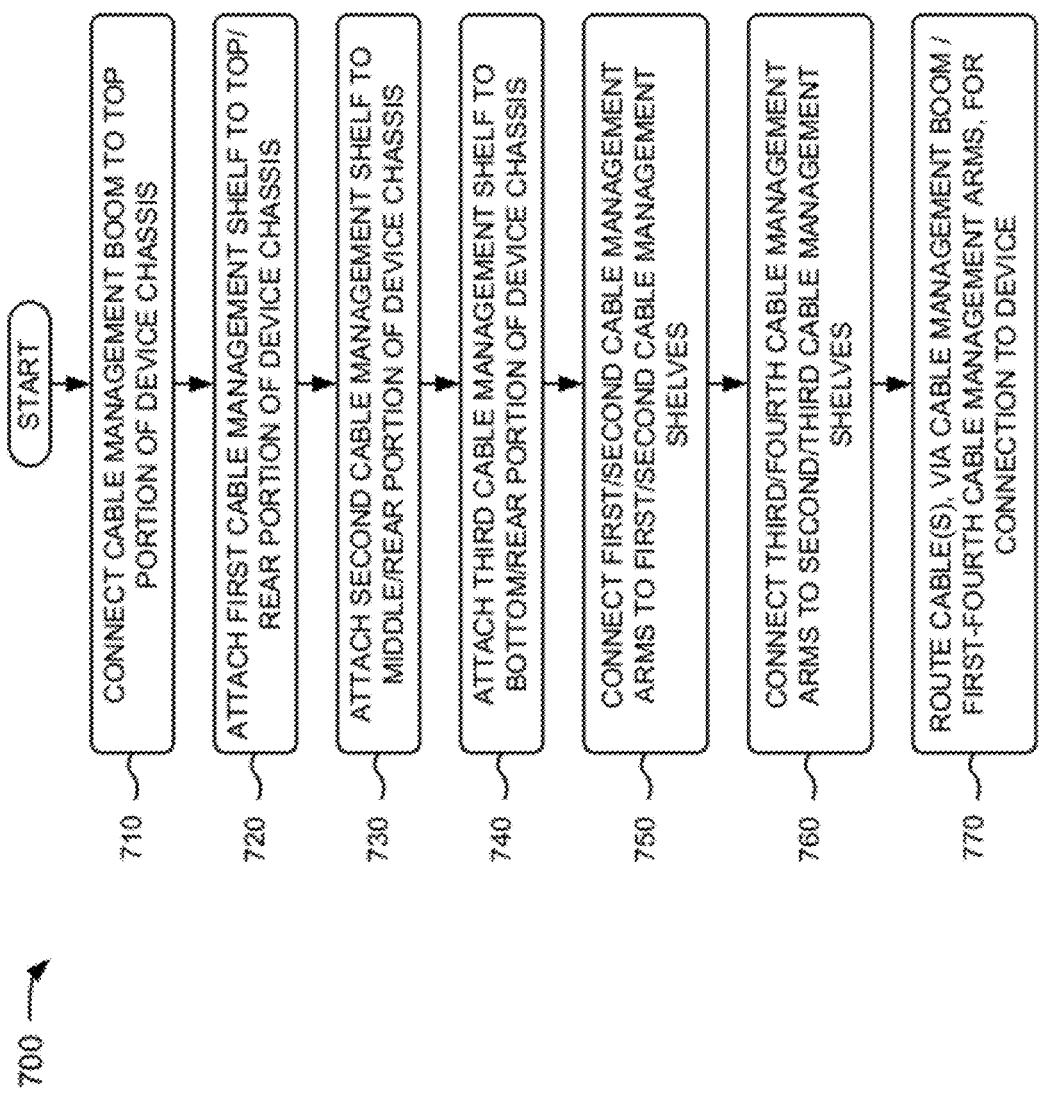

CABLE MANAGEMENT SYSTEM

BACKGROUND

Installation and management of communication cables requires precise placement of the communication cables without damaging them (e.g., via tight bends in the communication cables, inappropriate use of fasteners, inadequate support to the communication cables, etc.). For example, communication cables may be routed over and secured to surfaces (e.g., which may include sharp bends, sharp objects, etc.), without over-bending and damaging the communication cables. Communication cables may include telephone cables with copper conductors, coaxial cables, optical cables, etc. A minimum bend radius of a communication cable may be based on the type of cable, and bending the communication cable beyond the minimum bend radius can cause damage to the communication medium housed within the communication cable.

Installation and management of optical cables may be even more difficult because glass fibers used in optical cables are easily damaged when bent too sharply. The minimum bend radius of an optical cable depends upon a variety of factors, including the signal handled by the optical cable, the style of the optical cable, the size of the optical cable, and equipment to which the optical cable is connected. For example, optical cables may have a minimum bend radius of between about 0.75 inches to about 4.0 inches. Damaged optical cables may lead to a reduction in the signal transmission quality of the optical cables. The greater an optical cable is bent below its minimum bend radius, the greater the potential for breaking the fibers contained in the optical cable, and the shorter the life span of the optical cable.

Furthermore, recent increases in bandwidth requirements for telecommunications systems has resulted in more densely packed equipment and optical cables than prior telecommunications systems. Many carriers or other consumers of optical communications equipment have a very limited floor space in which to place new equipment and optical cables. Thus, it may be even more imperative to provide proper management of optical cables (e.g., to be able to bend optical cables around corners and other obstacles) in order to route the optical cables to and from optical communications equipment.

SUMMARY

According to one aspect, a system may manage cables to connect to a device provided in a device chassis. The system may include a cable management boom connected to a top portion of the device chassis, at least two cable management shelves connected to a side portion of the device chassis, and at least one cable management arm connected to and supported by the at least two cable management shelves. The at least one cable management arm may retain the cables, may pivot through an angle to provide access to the device provided in the device chassis, and may route the cables from the device to the cable management boom. The cable management boom may gather the cables, may retain the cables, and may route the cables above the device chassis.

According to another aspect, a cable management system may manage cables to connect to devices provided in a device chassis. The cable management system may include a cable management boom connected to a top portion of the device chassis, an upper cable management shelf connected to a side upper portion of the device chassis, a middle cable management shelf connected to a side middle portion of the device chassis, and a lower cable management shelf connected to a side lower portion of the device chassis. The cable management system may also include first and second cable management arms connected to and supported by the upper cable management shelf and the middle cable management shelf, and third and fourth cable management arms connected to and supported by the middle cable management shelf and the lower cable management shelf. Each of the cable management arms may operate independently of the other cable management arms, may retain a portion of the cables, may pivot through an angle to provide access to the devices provided in the device chassis, and may route the portion of the cables from at least one of the devices to the cable management boom. The cable management boom may bundle each portion of the cables exiting each of the cable management arms, retain each bundled portion of the cables, and route each bundled portion of the cables above the device chassis.

BRIEF DESCRIPTION OF THE DRAWINGS

The accompanying drawings, which are incorporated in and constitute a part of this specification, illustrate one or more implementations described herein and, together with the description, explain these implementations. In the drawings:

FIGS. 1A and 1B are diagrams illustrating an isometric view and a front view, respectively, of an exemplary system in which an exemplary cable management system described herein may be implemented;

FIG. 2A is a diagram depicting an isometric view of a cable management boom of the exemplary cable management system illustrated in FIGS. 1A and 1B;

FIG. 3A is a diagram depicting a top view of an upper cable management shelf of the exemplary cable management system illustrated in FIGS. 1A and 1B;

FIG. 3B is a diagram illustrating a top view of a middle cable management shelf of the exemplary cable management system depicted in FIGS. 1A and 1B;

FIG. 4 is a diagram illustrating connection of one of the cable management shelves depicted in FIGS. 3A-3C to a rear portion of a device chassis;

FIG. 5A is a diagram depicting connection of a cable management arm, of the exemplary cable management system illustrated in FIGS. 1A and 1B, to the upper cable management shelf illustrated in FIG. 3A;

FIG. 5B is a diagram illustrating connection of the cable management arm depicted in FIG. 5A to the middle cable management shelf depicted in FIG. 3B;

FIG. 6A is a diagram depicting a front view of a cable management arm of the exemplary cable management system illustrated in FIGS. 1A and 1B;

FIG. 6B is a diagram illustrating a partial isometric view of the cable management arm depicted in FIG. 6A; and FIG. 7 depicts a flowchart of an exemplary process for installing a cable management system and routing cables via the cable management system according to implementations described herein.

DETAILED DESCRIPTION

The following detailed description refers to the accompanying drawings. The same reference numbers in different drawings may identify the same or similar elements. Also, the following detailed description does not limit the invention.

Systems and/or methods described herein may provide a cable management system that ensures safe routing and attachment of cables (e.g., optical cables) to a device (e.g., an optical device). For example, in one implementation, the cable management system may include a cable management boom connected to a top portion of a device chassis (e.g., an optical device chassis), and cable management shelves connected to a side (e.g., a rear portion or a front portion) of the device chassis. The cable management shelves may connect to and support multiple cable management arms. Each of the cable management arms may manage a portion of cables to be connected to the device, may operate independently of the other cable management arms, and may pivot through an angle (e.g., a ninety degree angle) to provide access to a serviceable component (e.g., housed inside the device chassis) which may reside behind the cable management arms in a normal operating position. In one example, each cable management arm may manage thirty-two cables in eight groups of four cables each. Each cable management arm may include multiple cable clamps (e.g., where each cable clamp may be actuated by a corresponding lever) that retain cables in specific locations so that the lengths of the cables from the device chassis may be of equal distance. Cables exiting each cable management arm may be routed overhead to the cable management boom, and the cable management boom may gather and retain the cables. The cable management boom may be positioned so the cables may move appropriately when the cable management arms are pivoted between their normal operating positions and their service positions. From the cable management boom, the cables may be routed directly to overhead cable raceways.

The cable management system described herein may maintain minimum bend radii of cables routed by the cable management system, and may provide adequate support for the cables. The cable management system may provide a way to properly route cables away from the device chassis (e.g., a faceplate of the device chassis) by maintaining specific cable length and routing requirements that enable movement of the cable management arms. The moveable cable management arms may permit access to serviceable components (e.g., housed inside the device chassis) located behind the cable management system, without disrupting cables from adjacent components.

Exemplary Cable Management System Configuration

Figure 1B:
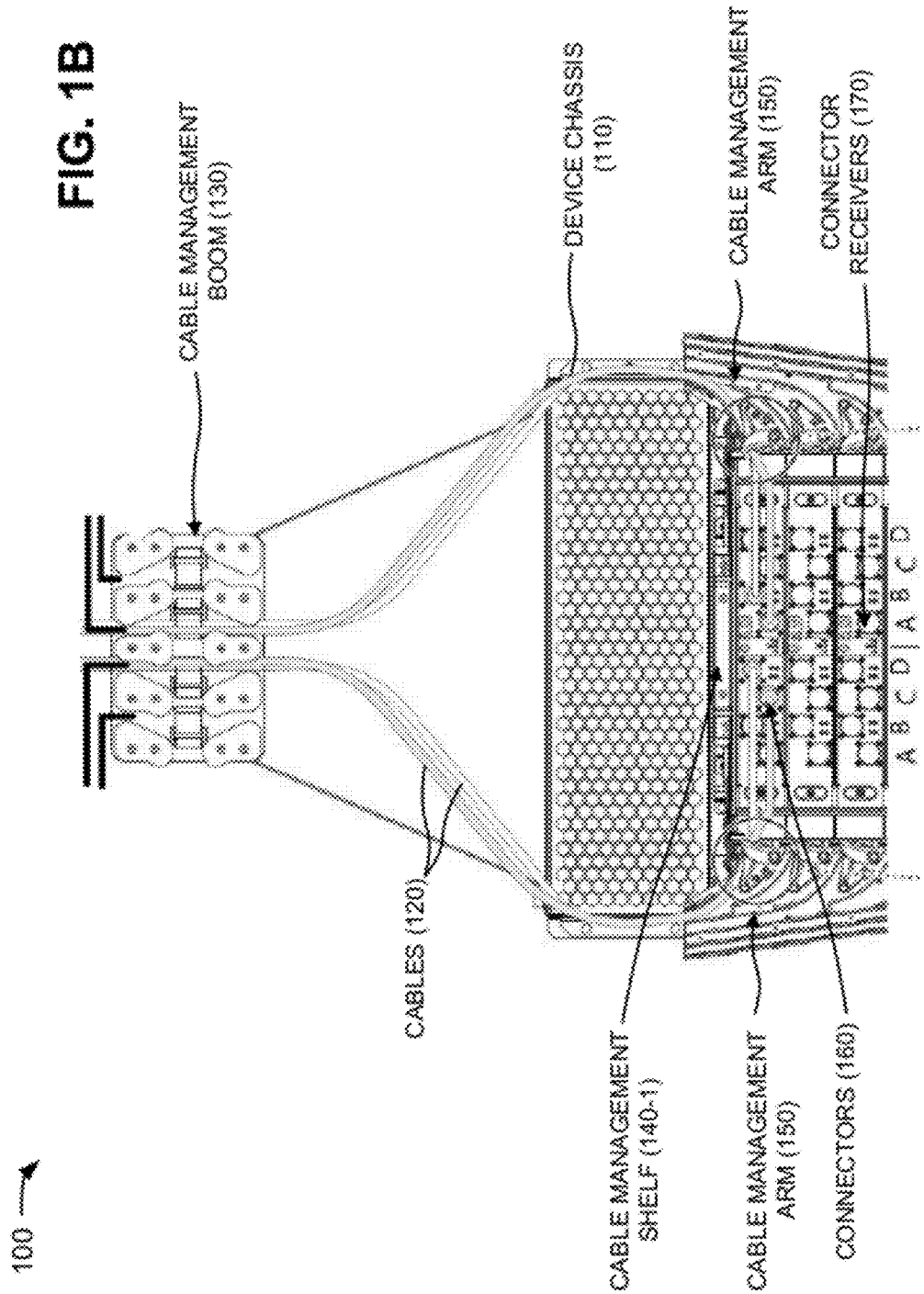

FIGS. 1A and 1B are diagrams illustrating an isometric view and a front view, respectively, of an exemplary system 100 in which an exemplary cable management system described herein may be implemented. As shown in FIGS. 1A and 1B, system 100 may include a device chassis 110, cables 120, and a cable management system that includes a cable management boom 130, cable management shelves 140-1, 140-2, and 140-3 (collectively referred to as "cable management shelves 140" and singularly as "cable management shelf 140"), and cable management arms 150.

Device chassis 110 may include a chassis that houses one or more network devices (e.g., gateways, routers, switches, firewalls, network interface cards (NICs), hubs, bridges, proxy servers, or some other type of devices that may process and/or transfer data), one or more computation or communication devices (e.g., personal computers, work stations, server devices, etc.), and/or any other devices capable of communicating with one or more cables, such as cables 120.

In one implementation, device chassis 110 may house additional components (not shown) depending upon the function of device chassis 110. Device chassis 110 may be sized and/or shaped to accommodate the one or more devices and/or components housed within device chassis 110, and the size and/or shape of device chassis 110 may depend on the number, size, and/or shape of the devices and/or components housed within device chassis 110.

Each of cables 120 may include any cable having a minimum bend radius, an optical cable, a communication cable with metal (e.g., copper) conductors, a coaxial cable, etc. In one exemplary implementation, each of cables 120 may include a cable capable of communicating with and/or connecting to the one or more devices and/or components provided in device chassis 110. In one example, each of cables 120 may include an optical cable with a minimum bend radius of between about 0.75 inches to about 4.0 inches. In another example, each of cables 120 may include a power cord, a communication cable, etc., that may provide electricity, electrical signals, optical signals, etc. to one or more devices and/or components housed inside device chassis 110.

Cable management boom 130 may connect to an upper portion of device chassis 110 via support legs, and may include a comb panel assembly connected to the support legs. Cable management boom 130 may route cables 120 to/from overhead cable raceways (not shown) from/to a rear portion of device chassis 110 (e.g., via cable management arms 150 and cable management shelves 140, as shown in FIG. 1B). Cable management boom 130 may bundle and retain cables 120 that are routed to/from the overhead cable raceways, and may be positioned (e.g., relative to device chassis 110) to permit cables 120 to move appropriately (e.g., without exceeding minimum bend radii) when cable management arms 150 are pivoted between their normal operating positions and their service positions. Cable management boom 130 may be sized and/or shaped to accommodate the number of cables 120 utilized in system 100, and the size and/or shape of cable management boom 130 may depend on the size and/or shape of device chassis 110 and/or cables 120. One or more components of cable management boom 130 may be made from a variety of materials, such as metals, metal alloys, high-strength plastics, and/or other materials meeting Network Equipment Building System (NEBS) reliability and flammability ratings. Further details of cable management boom 130 are provided below in connection with, for example, FIGS. 2A and 2B.

Each of cable management shelves 140 may connect to a rear portion (or front portion, depending upon where cables connect to device chassis 110) of device chassis 110, as shown in FIG. 1A. Cable management shelves 140 may connect to and support multiple cable management arms 150. For example, as shown in FIG. 1A, an upper cable management shelf 140-1 may connect to first ends of two upper cable management arms 150. A middle cable management shelf 140-2 may connect to second ends of the two upper cable management arms 150 and may connect to first ends of two lower cable management arms 150. A lower cable management shelf 140-3 may connect to second ends of the two lower cable management arms 150. Each cable management shelf 140 may include one or more brackets (e.g., that connects with an end of one of cable management arms 150) that pivot through an angle (e.g., a ninety degree angle) to provide access to a serviceable component (e.g., provided in device chassis 110) which may reside behind cable management arms 150 in a normal operating position.

Cable management shelves 140 may be sized and/or shaped to accommodate the number of cables 120 utilized in system 100, and the size and/or shape of cable management shelves 140 may depend on the size and/or shape of device chassis 110 and/or cables 120. One or more components of each cable management shelf 140 may be made from a variety of materials, such as metals, metal alloys, high-strength plastics, and/or other materials meeting NEBS reliability and flammability ratings. Although FIG. 1A shows three cable management shelves 140, in other implementations, more or less than three cable management shelves 140 may be utilized in system 100. Further details of cable management shelves 140 are provided below in connection with, for example, with FIGS. 3A-5B.

Each of cable management arms 150 may include a first end and a second end. The first end of each cable management arm 150 may connect to one of cable management shelves 140 and the second end of each cable management arm 150 may connect to another one of cable management shelves 140. Each of cable management arms 150 may manage a portion of cables 120 to be connected to devices and/or components housed inside device chassis 110, and may operate independently of the other cable management arms 150. Each cable management arm 150 may pivot through an angle (e.g., a ninety degree angle or some other angle) to provide access to a serviceable component (e.g., provided in device chassis 110) which may reside behind cable management arms 150 in a normal operating position. In one exemplary implementation, each cable management arm 150 may manage thirty-two cables 120 in eight groups of four cables 120 each. In other exemplary implementations, each cable management arm 150 may manage more or less cables 120 and/or grouping of cables 120. Each cable management arm 150 may include multiple cable clamps (e.g., where each cable clamp may be actuated by a corresponding lever) for retaining cables 120 in specific locations so that the lengths of cables 120 from device chassis 110 may be of equal distance.

Cable management arms 150 may be sized and/or shaped to accommodate the number of cables 120 utilized in system 100, and the size and/or shape of cable management arms 150 may depend on the size and/or shape of device chassis 110 and/or cables 120. One or more components of each cable management arm 150 may be made from a variety of materials, such as metals, metal alloys, high-strength plastics, and/or other materials meeting NEBS reliability and flammability ratings. Although FIG. 1A shows four cable management arms 150, in other implementations, more or less than four cable management arms 150 may be utilized in system 100. Further details of cable management arms 150 are provided below in connection with, for example, FIGS. 5A-6B.

As further shown in FIG. 1B, one or more connectors 160 attached to cables 120 may communicate (e.g., connect) with one or more connector receivers 170 associated with devices and/or components housed inside device chassis 110. Each of connectors 160 may include a power cord connector (e.g., a power supply connector, a plug, etc.); a communication cable connector (e.g., a Universal Serial Bus (USB) connector, an eight position, eight conductors (8P8C or "RJ45") connector, a nine-pin D-shell (DE-9) connector, etc.); an optical connector (e.g., a standard connector (SC), a ferrule connector (FC), a sub miniature A (SMA) connector, etc.); a telephone connector; etc. Each of connector receivers 170 may include a mechanism that is sized, shaped, and/or configured to receive a corresponding one of connectors 160. For example, if connector 160 is an optical connector, connector receiver 170 may be sized and shaped to receive the size and shape of the optical connector, and may include optical components that may communicate with corresponding optical components provided in connector 160. One or more of connector receivers 170 may attach one of connectors 160 to devices and/or components housed inside of device chassis 110, and may enable connectors 160 to communicate (e.g., electrically communicate, optically communicate, etc.) with the devices and/or components.

Although FIGS. 1A and 1B show exemplary components of system 100, in other implementations, system 100 may contain fewer, different, differently arranged, and/or additional components than depicted in FIGS. 1A and 1B. In still other implementations, one or more components of system 100 may perform one or more other tasks described as being performed by one or more other components of system 100.

Exemplary Cable Management Boom Configuration

Figure 2B:
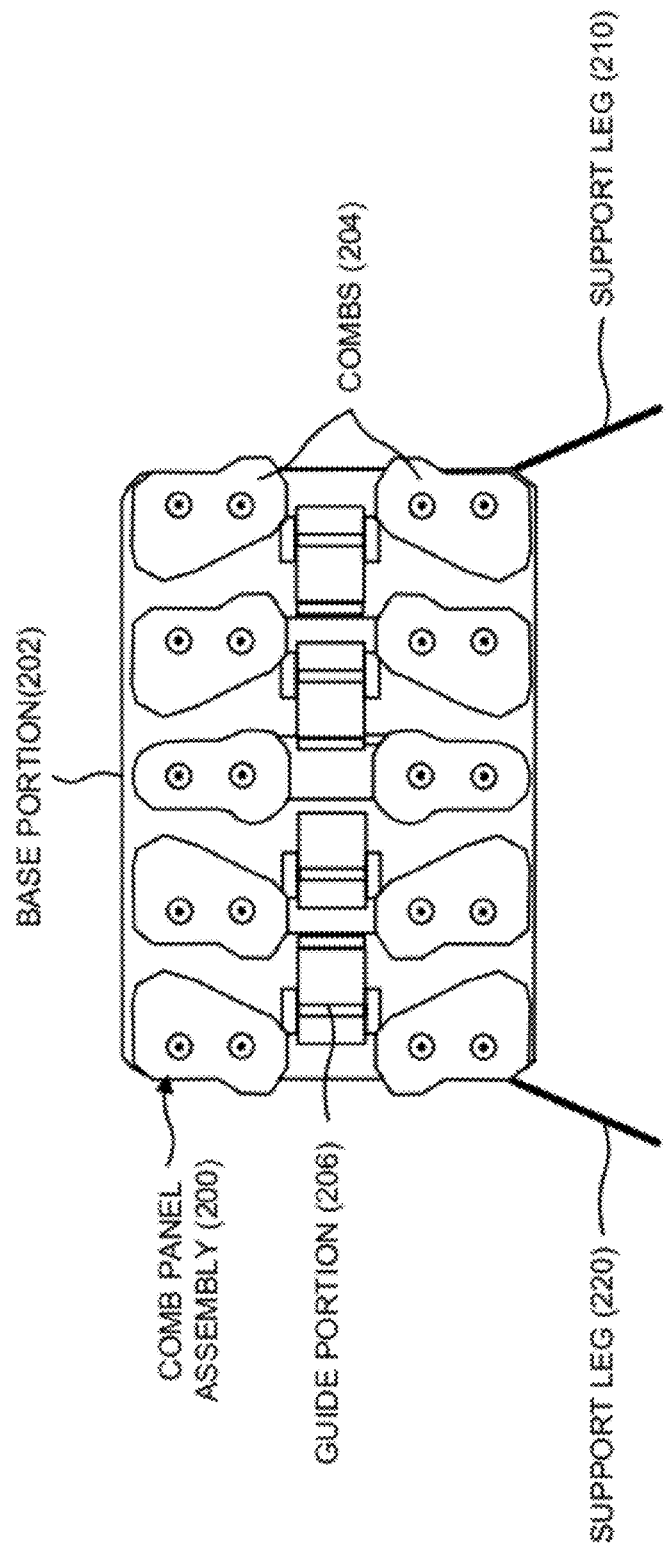
FIG. 2B is a diagram illustrating a front view of the cable management boom depicted in FIG. 2A.

FIGS. 2A and 2B are diagrams depicting an isometric view and a front view, respectively, of cable management boom 130. As shown in FIG. 2A, cable management boom 130 may include a comb panel assembly 200, a first support leg 210, and a second support leg 220. As further shown in FIG. 2A, comb panel assembly 200 may connect 230 (e.g., via connectors, such as screws, bolts, etc.) to upper ends of support legs 210 and 220, and lower ends of support legs 210 and 220 may connect 240 (e.g., via connectors, such as screws, bolts, etc.) to an upper portion of device chassis 110. Support legs 210 and 220 may be sized to position comb panel assembly 200 adjacent to cable raceways (not shown) provided overhead of device chassis 110. For example, the size of support legs 210 and 220 may depend on the height of device chassis 110 and/or how close the cable raceways are provided to a top of device chassis 110.

As shown in FIG. 2B, comb panel assembly 200 may include a base portion 202, one or more combs 204, and a guide portion 206. Combs 204 and guide portion 206 may connect to (or be integrally formed with) and extend away from base portion 202 (e.g., as best seen in FIG. 2A). Support legs 210 and 220 may connect to base portion 202 via connectors, such as screws, bolts, etc. Combs 204 may bundle and retain cables 120 that are routed to/from the overhead cable raceways, without bending cables 120 beyond their minimum bend radii. For example, cables 120 may be provided and/or retained between two or more combs 204. In another example, the middle six combs 204 may be used to guide cables 120 to the upper cable management arms 150 (e.g., as shown in FIG. 1B), and the outer eight combs 204 may be used to guide cables 120 to the lower cable management arms 150. In one exemplary implementation, each of combs 204 may be substantially pear-shaped, as shown in FIGS. 2A and 2B. In other implementations, each of combs 204 may be another shape, such as circular, square, rectangular, etc. Although FIGS. 2A and 2B show ten combs 204 for comb panel assembly 200, in other implementations, more or less than ten combs 204 may be provided with comb panel assembly 200.

Guide portion 206 may include one or more structures (e.g., walls) that guide cables 120 between combs 204. Base portion 202, combs 204, and/or guide portion 206 may be sized and/or shaped to accommodate the number of cables 120 utilized in system 100, and the size and/or shape of base portion 202, combs 204, and/or guide portion 206 may depend on the size and/or shape of device chassis 110 and/or cables 120.

Although FIGS. 2A and 2B show exemplary components of cable management boom 130, in other implementations, cable management boom 130 may contain fewer, different, differently arranged, and/or additional components than depicted in FIGS. 2A and 2B. In still other implementations, one or more components of cable management boom 130 may perform one or more other tasks described as being performed by one or more other components of cable management boom 130.

Exemplary Cable Management Shelf Configuration

FIG. 3A is a diagram depicting a top view of upper cable management shelf 140-1 (e.g., provided at an upper portion of device chassis 110 (FIG. 1A)). As shown, upper cable management shelf 140-1 may include pivoting brackets 300-1, a shelf body 310-1, mounting rods 320-1, and a keying pin 330-1.

Each of pivoting brackets 300-1 may pivotally connect to and extend away from shelf body 310-1. Each pivoting bracket 300-1 may connect with an upper end of one of the upper cable management arms 150, and may pivot through an angle (e.g., a ninety degree angle or some other angle) to provide access to a serviceable component (e.g., provided in device chassis 110) which may reside behind cable management arms 150 in a normal operating position. Each pivoting bracket 300-1 may include a locking mechanism that locks pivoting bracket 300-1 in a "normal" position or in a "service" position. Pivoting bracket 300-1 furthest to the right in FIG. 3A may be pivoted to and locked in the normal position, and pivoting bracket 300-1 furthest to the left in FIG. 3A may be pivoted to and locked in the service position. Pivoting brackets 300-1 may be sized and/or shaped to accommodate the number of cables 120 utilized in system 100, and the size and/or shape of pivoting brackets 300-1 may depend on the size and/or shape of device chassis 110 and/or cables 120.

Shelf body 310-1 may include a substantially flat, rectangular surface and mechanisms (e.g., pivots, not shown) that pivotally connect to pivoting brackets 300-1. Shelf body 310-1 may be sized and/or shaped to accommodate the number of cables 120 utilized in system 100, and the size and/or shape of shelf body 310-1 may depend on the size and/or shape of device chassis 110 and/or cables 120. For example, shelf body 310-1 may be sized to space cable management arms 150 (e.g., connected to pivoting brackets 300-1) away from device chassis 110 so that cables 120 (e.g., guided by cable management arms 150) do not exceed their minimum bend radii (e.g., when pivoting brackets 300-1 are in the normal position or the service position).

Mounting rods 320-1 may connect to and extend away from shelf body 310-1, and may be substantially cylindrical in shape. Mounting rods 320-1 may be sized and/or shaped to connect cable management shelf 140-1 to a rear portion of device chassis 110, as described below in connection with FIG. 4. For example, mounting rods 320-1 may include lengths and may be made from a material that ensure that cable management shelf 140-1 remains connected to device chassis 110 and is able to support cables 120 and cable management arms 150 associated with cable management shelf 140-1.

Keying pin 330-1 may include a substantially cylindrical-shaped pin that attaches to a particular location of shelf body 310-1 to enable cable management shelf 140-1 to be identified, as described below in connection with FIG. 3C. For example, shelf body 310-1 may include three keying pin locations (or positions) (e.g., keying pin position "A" for upper cable management shelf 140-1, keying pin position "B" for middle cable management shelf 140-2, and keying pin position "C" for lower cable management shelf 140-3). Keying pin 330-1 may also ensure that cable management shelf 140-1 is connected to an appropriate location of device chassis 110. For example, if keying pin 330-1 is provided in keying pin position "A" (e.g., indicating that keying pin 330-1 is associated with upper cable management shelf 140-1), cable management shelf 140-1 (e.g., via keying pin 330-1) may align with and be connected to the upper portion of device chassis 110 (e.g., the upper portion of device chassis 110 may include a opening that aligns with and receives keying pin 330-1).

FIG. 3B is a diagram illustrating a top view of middle cable management shelf 140-2 (e.g., provided at a middle portion of device chassis 110 (FIG. 1A)). As shown, middle cable management shelf 140-2 may include a shelf body 310-2, mounting rods 320-2, a keying pin 330-2, and pivoting brackets 340-2. Shelf body 310-2, mounting rods 320-2, and keying pin 330-2 may include the features described above for shelf body 310-1, mounting rods 320-1, and keying pin 330-1, respectively (FIG. 3A). However, keying pin 330-2 may be provided in keying pin position "B," which may indicate that keying pin 330-2 is associated with middle cable management shelf 140-2.

Each of pivoting brackets 340-2 may pivotally connect to and extend away from shelf body 310-1. Each pivoting bracket 340-2 may connect with a lower end of one of the upper cable management arms 150, and may pivot through an angle (e.g., a ninety degree angle or some other angle) to provide access to a serviceable component (e.g., provided in device chassis 110). Each pivoting bracket 340-2 may include a locking mechanism that locks pivoting bracket 340-2 in the normal position or in the service position. Pivoting bracket 340-2 furthest to the right in FIG. 3B may be pivoted to and locked in the normal position, and pivoting bracket 340-2 furthest to the left in FIG. 3B may be pivoted to and locked in the service position. Pivoting brackets 340-2 may be sized and/or shaped to accommodate the number of cables 120 utilized in system 100, and the size and/or shape of pivoting brackets 340-2 may depend on the size and/or shape of device chassis 110 and/or cables 120.

Although not shown in FIG. 3B, a corresponding pivoting bracket 300-2 (e.g., that includes the features described above for pivoting bracket 300-1) may be provided below each pivoting bracket 340-2. Pivoting brackets 300-2 may connect to upper ends of the lower cable management arms 150, and pivoting brackets 340-2 may connect to lower ends of the upper cable management arms 150.

As further shown in FIG. 3B, each pivoting bracket 340-2 (e.g., and each pivoting bracket associated with cable management shelves 140-1 and 140-3) may include a release tab 350-2. If release tab 350-2 is depressed (e.g., by a person or installer installing cables 120), pivoting bracket 340-2 may freely pivot relative to shelf body 310-2 so that pivoting bracket 340-2 may be manipulated between the normal position and the service position. If release tab 350-2 is not depressed, pivoting bracket 340-2 may be locked in the normal position or the service position.

Figure 3C:
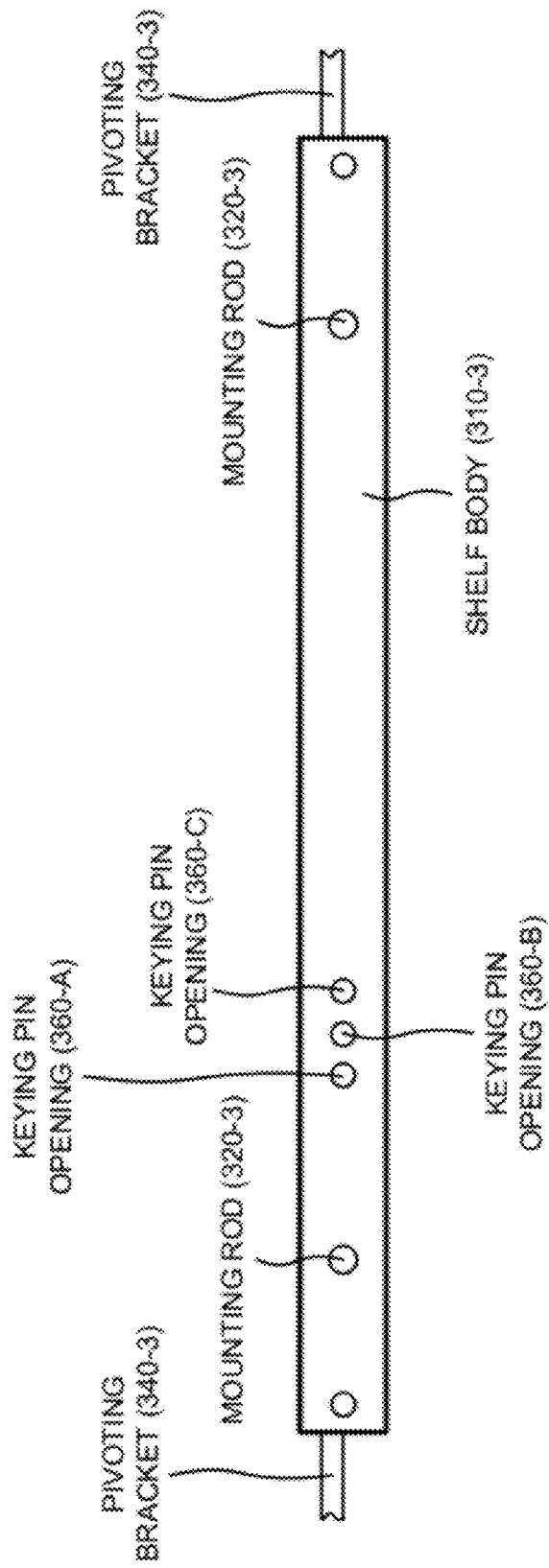
FIG. 3C is a diagram depicting a rear view of a lower cable management shelf of the exemplary cable management system illustrated in FIGS. 1A and 1B.

FIG. 3C is a diagram depicting a rear view of lower cable management shelf 140-3 (e.g., provided at a lower portion of device chassis 110 (FIG. 1A)). As shown, lower cable management shelf 140-3 may include a shelf body 310-3, mounting rods 320-3, pivoting brackets 340-3, and keying pin openings 360-A, 360-B, and 360-C. Shelf body 310-3, mounting rods 320-3, and pivoting brackets 340-3 may include the features described above for shelf body 310-1, mounting rods 320-1, and pivoting brackets 340-2, respectively (FIGS. 3A and 3B).

Keying pin opening 360-A may correspond to keying pin position "A" for upper cable management shelf 140-1. Keying pin opening 360-B may correspond to keying pin position "B" for middle cable management shelf 140-2. Keying pin opening 360-C may correspond to keying pin position "C" for lower cable management shelf 140-3. A keying pin 330-3 (not shown) may be provided in one of keying pin openings 360-A, 360-B, or 360-C to provide an indication of which cable management shelf 140 is associated with keying pin 330-3. For example, keying pin 330-3 may be provided in keying pin position 360-C, which may indicate that keying pin 330-3 is associated with lower cable management shelf 140-3.

FIG. 4 is a diagram 400 illustrating connection of one of cable management shelves 140 (e.g., where the pivoting brackets have been omitted for clarity) to a rear portion of device chassis 110. As shown, device chassis 110 may include mounting rod holes 410 and a keying pin hole 420. Mounting rod holes 410 may be sized and/or shaped to receive and retain mounting rods 320 within device chassis 110. Keying pin hole 420 may be sized and/or shaped to receive keying pin 330. As further shown in FIG. 4, in order to connect cable management shelf 140 to device chassis 110, mounting rods 320 and keying pin 330 may be aligned with mounting rod holes 410 and keying pin hole 420, respectively, and cable management shelf 140 may be moved in a direction 430 toward device chassis 110. When mounting rods 320 are provided fully within mounting rod holes 410, captive screws 440 (e.g., provided on the left and right sides of each cable management shelf 140) may be tightened to securely connect cable management shelf 140 to device chassis 110. This process may be repeated for each of cable management shelves 140.

Once cable management shelves 140 are connected to device chassis 110, cable management arms 150 may be connected to cable management shelves 140. FIG. 5A is a diagram 500 depicting connection of an upper, right cable management arm 150 (FIG. 1B) to upper cable management shelf 140-1. As shown, pivoting bracket 300-1 of cable management shelf 140-1 may be provided in the service position, and cable management arm 150 may be aligned with pivoting bracket 300-1. When cable management arm 150 is aligned with pivoting bracket 300-1, one or more connectors 510 (e.g., screw, bolts, etc.) may be used to connect pivoting bracket 300-1 (e.g., cable management shelf 140-1) to cable management arm 150.

FIG. 5B is a diagram illustrating connection of the upper, right cable management arm 150 to middle cable management shelf 140-2. As shown, pivoting bracket 300-2 of cable management shelf 140-2 may be provided in the service position, and cable management arm 150 may be aligned with pivoting bracket 300-2. When cable management arm 150 is aligned with pivoting bracket 300-2, one or more connectors 510 (e.g., screw, bolts, etc.) may be used to connect pivoting bracket 300-2 (e.g., cable management shelf 140-2) to cable management arm 150. The connection process depicted in FIGS. 5A and 5B may be repeated for each of cable management arms 150.

Although FIGS. 3A-5B show exemplary components of cable management shelves 140, in other implementations, cable management shelves 140 may contain fewer, different, differently arranged, and/or additional components than depicted in FIGS. 3A-5B. In still other implementations, one or more components of cable management shelves 140 may perform one or more other tasks described as being performed by one or more other components of cable management shelves 140.

Exemplary Cable Management Arm Configuration

FIGS. 6A and 6B are diagrams depicting a front view and a partial isometric view, respectively, of cable management arm 150. As shown in FIG. 6A, cable management arm 150 may include longer guides 600, shorter guides 610, multiple levers 620-1, . . . , 620-8 (collectively referred to as "levers 620" and singularly as "lever 620"), and multiple cable clamps 630-1, . . . , 630-8 (collectively referred to as "cable clamps 630" and singularly as "cable clamp 630").

Each of longer guides 600 may include a structure (e.g., a wall, a planar structure, etc.) that guides cables 120 along cable management arm 150 and to one of cable clamps 630. For example, as shown in FIG. 6A, the two left-most longer guides 600 may guide cables 120 to cable clamps 630-7 and 630-8, the two middle longer guides 600 may guide cables 120 to cable clamps 630-5 and 630-6, and the two right-most longer guides 600 may guide cables 120 to cable clamps 630-3 and 630-4. Although FIG. 6A shows four longer guides 600, in other implementations, more or less than four longer guides 600 may be provided with cable management arm 150. Longer guides 600 may be sized and/or shaped to accommodate the number of cables 120 utilized in system 100, and the size and/or shape of longer guides 600 may depend on the size and/or shape of device chassis 110 and/or cables 120. In one exemplary implementation, longer guides 600 may be shaped so that cables 120 (e.g., guided by longer guides 600) do not exceed their minimum bend radii (e.g., via shorter guides integrally formed at bottom portions of longer guides 600).

Each of shorter guides 610 may be shorter in length than each of longer guides 600, and may include a structure (e.g., a wall, a planar structure, etc.) that guides cables 120 along cable management arm 150 and to one of cable clamps 630. For example, as shown in FIG. 6A (e.g., from the top down), the top-most shorter guide 610 may guide cables 120 to cable clamp 630-1, the second top-most shorter guide 610 may guide cables 120 to cable clamp 630-2, the right-most longer guide 600 may guide cables 120 to cable clamp 630-3, the third top-most shorter guide 610 may guide cables to cable clamp 630-4, the second right-most longer guide 600 may guide cables 120 to cable clamp 630-5, the fourth top-most shorter guide 610 may guide cables to cable clamp 630-6, the third right-most longer guide 600 may guide cables 120 to cable clamp 630-7, and the fifth top-most shorter guide 610 may guide cables 120 to cable clamp 630-8. Although FIG. 6A shows five shorter guides 610, in other implementations, more or less than five shorter guides 610 may be provided with cable management arm 150. Shorter guides 610 may be sized and/or shaped to accommodate the number of cables 120 utilized in system 100, and the size and/or shape of shorter guides 610 may depend on the size and/or shape of device chassis 110 and/or cables 120. In one exemplary implementation, shorter guides 610 may be shaped so that cables 120 (e.g., guided by shorter guides 610) do not exceed their minimum bend radii.

Each of levers 620 may include mechanisms (e.g., a cam attached to a pivot) that engages a corresponding one of cable clamps 630 and causes the corresponding cable clamp 630 to move up or down. Lever 620 and cable clamp 630 may be in a "locked" position when lever 620 causes cable clamp 630 to move up (e.g., towards one of longer guides 600 or shorter guides 610). Lever 620 and cable clamp 630 may be in a "released" position when lever 620 causes cable clamp 630 to move down (e.g., away from one of longer guides 600 or shorter guides 610). When cables 120 are to be installed in cable management arm 150, levers 620 and cable clamps 630 may be provided in their released positions. Further details of the interactions of levers 620 and cable clamps 630 are provided below in connection with, for example, FIG. 6B. Levers 620 may be sized and/or shaped so that they may be easily manipulated by a person(s) installing cables 120 in system 100.

Each of cable clamps 630 may include mechanisms (e.g., cable troughs and cable guides) that receive cables 120, and retain cables 120 within cable management arm 150. Each cable clamp 630 may be actuated by a corresponding one of levers 620 to provide each cable clamp 630 in the locked position or the released position, as described above. In one example, each cable clamp 630 may retain cables 120 in specific locations so that the lengths of cables 120 from device chassis 110 may be of equal distance. In one exemplary implementation, each cable clamp 630 may retain four cables 120 when provided in the locked position.

FIG. 6B provides further details of levers 620 and cable clamps 630. As shown in FIG. 6B, each of levers 620 (e.g., with reference to first lever 620-1) may include a pivot 622-1 connected to a cam (not shown) that engages a corresponding one of cable clamps 630 (e.g., cable clamp 630-1) and causes the corresponding cable clamp 630 to move up or down. Pivot 622-1 may enable each lever 620 to pivot from the locked position to the released position and vice versa. For example, first lever 620-1 may be in the locked position (e.g., cable clamp 630-1 may be moved up toward one of shorter guides 610), and second lever 620-2 may be in the released position (e.g., cable clamp 630-2 may be moved down away from one of shorter guides 610).

As further shown in FIG. 6B, each of cable clamps 630 (e.g., with reference to second cable clamp 630-2) may include a pivot 632-2, a body portion 634-2, four cable troughs 636-2, and three cable guides 638-2. Pivot 632-2 may enable cable clamp 630-2 to move up or down (e.g., from the locked position to the released position in response to actuation of lever 620-2). Body portion 634-2 may include a substantially flat, rectangular surface and may pivotally connect to pivot 632-2. Cable troughs 636-2 and cable guides 638-2 may be integrally formed with body portion 634-2 and may be sized and/or shaped to define spaces for receiving and retaining cables 120 (e.g., four cables 120). In one exemplary implementation, cable troughs 636-2 may be labeled (e.g., "A," "B," "C," and "D") to correspond to each of the four cables 120. When cables 120 are installed in cable management arm 150, cable clamp 620-2 may be in the released position (e.g., as shown in FIG. 6B), and cables 120 may be provided in one or more of cable troughs 636-2. Once cables 120 are provided in cable troughs 636-2, lever 620-2 may be rotated to the locked position, cable clamp 630-2 may move up toward one of shorter guides 610, and cables 120 may be retained in between cable clamp 630-2 and one of shorter guides 610.

Cables 120 may be installed and routed between device chassis 110 and the cable management system (e.g., cable management boom 130, cable management arms 150, and cable management shelves 140) in a particular order. For example, cables 120 may be loaded in one cable management arm 150 at a time and may be installed from top to bottom on each cable management arm 150. If cables 120 are to be installed in the right side of device chassis 110, the installer may begin with connecting a cable 120 near the center of device chassis 110 and may work outwards to a cable 120 to be connected near the right side of device chassis 110. If cables 120 are to be installed in the left side of device chassis 110, the installer may begin with connecting a cable 120 near the center of device chassis 110 and may work outwards to a cable 120 to be connected near the left side of device chassis 110. In other words, cables 120 may be installed from the inside out of device chassis 110.

In another example, the installer may connect a cable 120 (e.g., labeled cable "A") to a component housed inside of device chassis 110, and may route cable "A" into a corresponding cable trough 636-2 (e.g., a cable trough labeled "A") of cable management arm 150 (FIG. 6B). The installer may route cable "A" through one or more of longer guides 600 and/or shorter guides 610 of cable management arm 150 (FIG. 6B) and into comb panel assembly 200 of cable management boom 130 (FIG. 2A). This installation process may be repeated for cables 120 labeled "B," "C," and "D." Once all four cables 120 are in position in cable troughs 636-2 of cable clamp 630-2, the installer may rotate lever 620-2 to move cable clamp 630-2 into the locked position. The installer may not pull cables 120 tight between the component housed inside of device chassis 110 and cable management arm 150 in order to ensure provision of large, smooth bend radii for cables 120. Provision of large, smooth bend radii for cables 120 may enable proper cable management arm 150 movement when pivoted into the service position, without exceeding the minimum bend radii of cables 120. This installation process may be repeated until all of cables 120 for a particular cable management arm 150 are routed, and may be performed for any remaining cable management arms 150.

Cables 120 exiting a particular cable management arm 150 and provided to comb panel assembly 200 of cable management boom 130 may be secured in a bundle at one or more lengths of cables 120 using one or more bundling mechanisms (e.g., tie wraps, Velcro straps, etc.). When cables 120 are bundled as they exit each cable management arm 150, each group of cables 120 may be individually bundled (e.g., bundles of cables 120 from upper and lower cable management arms 150 may not be strapped together so that the upper and lower cable management arms 150 may move independently between the service and normal positions). After the bundles of cables 120 exit the top of comb panel assembly 200, the installer may strap the bundles of cables 120 together as appropriate.

Although FIGS. 6A and 6B show exemplary components of cable management arm 150, in other implementations, cable management arm 150 may contain fewer, different, differently arranged, and/or additional components than depicted in FIGS. 6A and 6B. In still other implementations, one or more components of cable management arm 150 may perform one or more other tasks described as being performed by one or more other components of cable management arm 150.

Exemplary Process

FIG. 7 depicts a flowchart of an exemplary process 700 for installing a cable management system and routing cables via the cable management system according to implementations described herein. As shown in FIG. 7, process 700 may include connecting a cable management boom to a top portion of a device chassis (block 710). For example, in implementations described above in connection with FIG. 2A, cable management boom 130 may include comb panel assembly 200, first support leg 210, and second support leg 220. Comb panel assembly 200 may connect 230 (e.g., via connectors, such as screws, bolts, etc.) to upper ends of support legs 210 and 220, and lower ends of support legs 210 and 220 may connect 240 (e.g., via connectors, such as screws, bolts, etc.) to an upper portion of device chassis 110. Support legs 210 and 220 may be sized to position comb panel assembly 200 adjacent to cable raceways (not shown) provided overhead of device chassis 110. For example, the size of support legs 210 and 220 may depend on the height of device chassis 110 and/or how close the cable raceways are provided to a top of device chassis 110.

As further shown in FIG. 7, process 700 may include attaching a first cable management shelf to a top rear portion of the device chassis (block 720), attaching a second cable management shelf to a middle rear portion of the device chassis (block 730), and attaching a third cable management shelf to a bottom rear portion of the device chassis (block 740). For example, in implementations described above in connection with FIG. 4, device chassis 110 may include mounting rod holes 410 and keying pin hole 420. Mounting rod holes 410 may be sized and/or shaped to receive and retain mounting rods 320 within device chassis 110. Keying pin hole 420 may be sized and/or shaped to receive keying pin 330. In order to connect cable management shelf 140 to device chassis 110, mounting rods 320 and keying pin 330 may be aligned with mounting rod holes 410 and keying pin hole 420, respectively, and cable management shelf 140 may be moved in a direction 430 toward device chassis 110. When mounting rods 320 are provided fully within mounting rod holes 410, captive screws 440 (e.g., provided on the left and right sides of each cable management shelf 140) may be tightened to securely connect cable management shelf 140 to device chassis 110. This process may be repeated for each of cable management shelves 140.

Returning to FIG. 7, first and second cable management arms may be connected to the first and second cable management shelves (block 750), and third and fourth cable management arms may be connected to the second and third cable management shelves (block 760). For example, in implementations described above in connection with FIGS. 5A and 5B, once cable management shelves 140 are connected to device chassis 110, cable management arms 150 may be connected to cable management shelves 140. Pivoting bracket 300-1 of cable management shelf 140-1 may be provided in the service position, and cable management arm 150 may be aligned with pivoting bracket 300-1. When cable management arm 150 is aligned with pivoting bracket 300-1, one or more connectors 510 (e.g., screw, bolts, etc.) may be used to connect pivoting bracket 300-1 (e.g., cable management shelf 140-1) to cable management arm 150. Pivoting bracket 300-2 of cable management shelf 140-2 may be provided in the service position, and cable management arm 150 may be aligned with pivoting bracket 300-2. When cable management arm 150 is aligned with pivoting bracket 300-2, one or more connectors 510 (e.g., screw, bolts, etc.) may be used to connect pivoting bracket 300-2 (e.g., cable management shelf 140-2) to cable management arm 150. The connection process may be repeated for each of cable management arms 150.

As further shown in FIG. 7, process 700 may include routing one or more cables, via the cable management boom and the first-fourth cable management arms, for connection with a device housed inside the device chassis (block 770). For example, in implementations described above in connection with FIGS. 6A and 6B, cables 120 may be installed and routed between device chassis 110 and the cable management system (e.g., cable management boom 130, cable management arms 150, and cable management shelves 140) in a particular order. Cables 120 may be loaded in one cable management arm 150 at a time and may be installed from top to bottom on each cable management arm 150. Cables 120 may be installed from the inside out of device chassis 110. The installer may connect a cable 120 (e.g., labeled cable "A") to a component housed inside of device chassis 110, and may route cable "A" into a corresponding cable trough 636-2 (e.g., a cable trough labeled "A") of cable management arm 150. The installer may route cable "A" through one or more of longer guides 600 and/or shorter guides 610 of cable management arm 150 and into comb panel assembly 200 of cable management boom 130. This installation process may be repeated for cables 120 labeled "B," "C," and "D." Once all four cables 120 are in position in cable troughs 636-2 of cable clamp 630-2, the installer may rotate lever 620-2 to move cable clamp 630-2 into the locked position. This installation process may be repeated until all of cables 120 for a particular cable management arm 150 are routed, and may be performed for any remaining cable management arms 150.

CONCLUSION

Systems and/or methods described herein may provide a cable management system that ensures safe routing and attachment of cables to a device. For example, in one implementation, the cable management system may include a cable management boom connected to a top portion of a device chassis, and cable management shelves connected to a rear portion of the device chassis. The cable management shelves may connect to and support multiple cable management arms. Each of the cable management arms may manage a portion of cables to be connected to the device, may operate independently of the other cable management arms, and may pivot through an angle to provide access to a serviceable component (e.g., housed inside the device chassis) which may reside behind the cable management arm in a normal operating position. Cables exiting each cable management arm may be routed overhead to the cable management boom, and the cable management boom may gather and retain the cables. From the cable management boom, the cables may be routed directly to overhead cable raceways.

The foregoing description provides illustration and description, but is not intended to be exhaustive or to limit the embodiments to the precise form disclosed. Modifications and variations are possible in light of the above teachings or may be acquired from practice of the invention. For example, while a series of blocks has been described with regard to the flowcharts of FIG. 7, the order of the blocks may differ in other implementations. Further, non-dependent blocks may be performed in parallel.

Even though particular combinations of features are recited in the claims and/or disclosed in the specification, these combinations are not intended to limit the invention. In fact, many of these features may be combined in ways not specifically recited in the claims and/or disclosed in the specification.

No element, act, or instruction used in the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A system comprising:
   a cable management boom connected to a top portion of a device chassis, the cable management boom comprising:
   support legs connected to the top portion of the device chassis, and a comb panel assembly connected to the support legs;
   at least two cable management shelves connected to a side portion of the device chassis; and
   at least one cable management arm connected to and supported by the at least two cable management shelves, the at least one cable management arm being to:

retain cables,
pivot through an angle to provide access to a device provided in the device chassis, and
route the cables from the device to the cable management boom,
the cable management boom being to:
gather the cables,
retain the cables, and
route the cables above the device chassis, and
the comb panel assembly being to:
gather the cables,
retain the cables, and
route the cables above the device chassis.

2. The system of claim 1, where the comb panel assembly comprises:
a base portion;
a plurality of combs connected to and extending away from the base portion; and
a guide portion connected to and extending away from the base portion,
the plurality of combs and the guide portion communicating with each other to gather, retain, and route the cables above the device chassis.

3. The system of claim 1, where each cable management shelf of the at least two cable management shelves comprises:
a shelf body; and
at least one pivoting bracket pivotally connected to and extending away from the shelf body,
the at least one pivoting bracket, connecting to an end of the at least one cable management arm and enabling the at least one cable management arm to pivot through an angle to provide access to the device provided in the device chassis.

4. The system of claim 3, where each cable management shelf of the at least two cable management shelves further comprises:
mounting rods that are received in openings provided in the device chassis in order to connect each cable management shelf to the device chassis; and
a keying pin that identifies each cable management shelf and ensures that each cable management shelf is connected at a correct location of the device chassis.

5. The system of claim 1, where the at least one cable management arm comprises:
a cable clamp;
a lever that actuates the cable clamp to cause the cable clamp to move;
a longer guide; and
a shorter guide,
the shorter guide communicating with the longer guide to provide a route for the cables to the cable clamp.

6. A cable management system for managing cables to connect to devices provided in a device chassis, the cable management system comprising:
a cable management boom connectable to a top portion of the device chassis;
an upper cable management shelf connectable to a side upper portion of the device chassis;
a middle cable management shelf connectable to a side middle portion of the device chassis;
a lower cable management shelf connectable to a side lower portion of the device chassis;
a first cable management arm and a second cable management arm connectable to and supported by the upper cable management shelf and the middle cable management shelf; and
a third cable management arm and a fourth cable management arms arm connectable to and supported by the middle cable management shelf and the lower cable management shelf,
each of the first cable management arm, the second cable management arm the third cable management arm, and fourth cable management arms being to:
operate independently of the other cable management arms;
retain a portion of the cables,
pivot through an angle to provide access to the devices provided in the device chassis, and
route the portion of the cables from at least one of the devices to the cable management boom, and
the cable management boom being to:
bundle each portion of the cables exiting each of the first and second cable management arms and the third and fourth cable management arms,
retain each bundled portion of the cables, and
route each bundled portion of the cables above the device chassis.

7. The cable management system of claim 6, where the cable management boom comprises:
two support legs connected to the top portion of the device chassis; and
a comb panel assembly connected to the two support legs, the comb panel assembly being to:
bundle each portion of the cables exiting each of the first cable management arm, the second cable management arms arm, the third cable management arm, and fourth cable management arms,
retain each bundled portion of the cables, and
route each bundled portion of the cables above the device chassis.

8. The cable management system of claim 7,
where the comb panel assembly comprises:
a base portion;
a plurality of combs connected to and extending away from the base portion; and
a guide portion connected to and extending away from the base portion,
where a first portion of the plurality of combs communicate with each other to bundle, retain, and route the portion of the cables exiting the first cable management arm,
where a second portion of the plurality of combs communicate with each other to bundle, retain, and route the portion of the cables exiting the second cable management arm,
where a third portion of the plurality of combs communicate with each other to bundle, retain, and route the portion of the cables exiting the third cable management arm, and
where a fourth portion of the plurality of combs communicate with each other to bundle, retain, and route the portion of the cables exiting the fourth cable management arm.

9. The cable management system of claim 6, where the upper cable management shelf comprises:
a shelf body;
a first bracket pivotally connected to and extending away from the shelf body,
the first bracket connecting to an upper end of the first cable management arm and enabling the first cable management arm to pivot through an angle to provide access to the devices provided in the device chassis;
a second bracket pivotally connected to and extending away from the shelf body, where the second bracket being spaced from the first bracket, connecting to an upper end of the second cable management arm, and enabling the second cable management arm to pivot through an angle to provide access to the devices provided in the device chassis;

mounting rods that are received in openings provided in the device chassis in order to connect the upper cable management shelf to the device chassis; and a keying pin that identifies the upper cable management shelf and ensures that the upper cable management shelf is connected at the side upper portion of the device chassis.

10. The cable management system of claim 6, where the middle cable management shelf comprises:

a shelf body;

a first bracket pivotally connected to and extending away from the shelf body,
the first bracket connecting to a lower end of the first cable management arm and enabling the first cable management arm to pivot through an angle to provide access to the devices provided in the device chassis;

a second bracket pivotally connected to and extending away from the shelf body,
the second bracket being spaced from the first bracket, connecting to a lower end of the second cable management arm, and enabling the second cable management arm to pivot through an angle to provide access to the devices provided in the device chassis;

a third bracket pivotally connected to and extending away from the shelf body,
the third bracket being provided below the first bracket, connecting to an upper end of the third cable management arm, and enabling the third cable management arm to pivot through an angle to provide access to the devices provided in the device chassis;

a fourth bracket pivotally connected to and extending away from the shelf body,
the fourth bracket being provided below the second bracket, connecting to an upper end of the fourth cable management arm, and enabling the fourth cable management arm to pivot through an angle to provide access to the devices provided in the device chassis;

mounting rods that are received in openings provided in the device chassis in order to connect the middle cable management shelf to the device chassis; and a keying pin that identifies the middle cable management shelf and ensures that the middle cable management shelf is connected at the side middle portion of the device chassis.

11. The cable management system of claim 6, where the lower cable management shelf comprises:

a shelf body;

a first bracket pivotally connected to and extending away from the shelf body,
the first bracket connecting to a lower end of the third cable management arm and enabling the third cable management arm to pivot through an angle to provide access to the devices provided in the device chassis;

a second bracket pivotally connected to and extending away from the shelf body,
the second bracket being spaced from the first bracket, connecting to a lower end of the fourth cable management arm, and enabling the fourth cable management arm to pivot through an angle to provide access to the devices provided in the device chassis;

mounting rods that are received in openings provided in the device chassis in order to connect the lower cable management shelf to the device chassis; and a keying pin that identifies the lower cable management shelf and ensures that the lower cable management shelf is connected at the side lower portion of the device chassis.

12. The cable management system of claim 6, where the first cable management arms comprises:

a plurality of cable clamps;

a plurality of levers,
each of the plurality of levers actuating a corresponding one of the plurality of cable clamps to cause the corresponding one of the plurality of cable clamps to move;

a plurality of longer guides; and a plurality of shorter guides,
the plurality of shorter guides communicating with each other and the plurality of longer guides to provide routes for the portion of the cables to the plurality of cable clamps.

13. The cable management system of claim 12,
where each of the plurality of cable clamps is to receive four cables, and
where each of the plurality of cable clamps is to retain the four cables against a corresponding one of the plurality of shorter guides.

14. The cable management system of claim 12, where the plurality of longer guides and the plurality of shorter guides provide routes for the portion of the cables that do not exceed minimum bend radii of the portion of the cables.

15. The cable management system of claim 12, where each of the plurality of levers comprises:

a cam; and a pivot attached to the cam,
the pivot enabling each of the plurality of levers to rotate to cause the cam to move a corresponding one of the plurality of cable clamps.

16. The cable management system of claim 12, where each of the plurality of cable clamps comprises:

a pivot; and a body portion pivotally connected to the pivot,
the body portion including:
three cable guides, and
four cable troughs,
each cable trough, of the four cable troughs, being to receive and retain a single cable from the portion of the cables.

17. A system comprising:

a cable management boom connected to a top portion of a device chassis;

two cable management shelves connected to a side portion of the device chassis; and a cable management arm connected to and supported by the at least two cable management shelves,
the cable management arm being to:
retain cables,
pivot through an angle to provide access to a device provided in the device chassis, and
route the cables from the device to the cable management boom,
the cable management arm comprising:
a cable clamp,
a lever that actuates the cable clamp to cause the cable clamp to move,
a longer guide, and a shorter guide that communicates with the longer guide to provide a route for the cables to the cable clamp, and the cable management boom being to:
gather the cables,
retain the cables, and
route the cables above the device chassis.

18. The system of claim 17,
where the cable clamp is to receive up to four cables, and
where the cable clamp retains the received cables against the shorter guide when the lever actuates the cable clamp to move up.

19. The system of claim 17, where the longer guide and the shorter guide route the cables to the cable clamp without exceeding minimum bend radii of the cables.

20. The system of claim 17, where the lever comprises:
a cam; and
a pivot attached to the cam,
the pivot enabling the lever to rotate and where rotation of the lever causes the cam to move the cable clamp.

21. The system of claim 17, where the cable clamp comprises:
a pivot; and
a body portion pivotally connected to the pivot,
the body portion including:
three cable guides, and
four cable troughs,
each cable trough, of the four cable troughs, being to receive and retain one of the cables.

22. A system comprising:
a cable management boom connected to a top portion of a device chassis;
two cable management shelves connected to a side portion of the device chassis; and
a cable management arm connected to and supported by the at least two cable management shelves,
the cable management arm being to:
retain cables,
pivot through an angle to provide access to a device provided in the device chassis, and
route the cables from the device to the cable management boom,
the cable management boom being to:
gather the cables,
retain the cables, and
route the cables above the device chassis;
a first cable management shelf of the two cable management shelves comprises:
a shelf body,
a pivoting bracket pivotally connected to and extending away from the shelf body,
mounting rods that are received in openings provided in the device chassis in order to connect the first cable management shelf to the device chassis, and
a keying pin that identifies the first cable management shelf and ensures that the first cable management shelf is connected at a correct location of the device chassis, and
the pivoting bracket connecting to an end of the cable management arm and enabling the cable management arm to pivot through an angle to provide access to the device provided in the device chassis.

\* \* \* \* \*